(12) United States Patent
Yang et al.

(10) Patent No.: US 9,171,898 B2
(45) Date of Patent: Oct. 27, 2015

(54) METHOD FOR MANUFACTURING SEMICONDUCTOR LAYOUT PATTERN, METHOD FOR MANUFACTURING SEMICONDUCTOR DEVICE, AND SEMICONDUCTOR DEVICE

(71) Applicant: UNITED MICROELECTRONICS CORP., Hsin-Chu (TW)

(72) Inventors: Yu-Shiang Yang, Tainan (TW); Cheng-Te Wang, Hsinchu County (TW)

(73) Assignee: UNITED MICROELECTRONICS CORP., Science-Based Industrial Park, Hsin-Chu (TW)

(*) Notice: Subject to any disclaimer, the term of this patent is extended or adjusted under 35 U.S.C. 154(b) by 381 days.

(21) Appl. No.: 13/674,965

(22) Filed: Nov. 13, 2012

(65) Prior Publication Data

US 2014/0131832 A1    May 15, 2014

(51) Int. Cl.
| | |
|---|---|
| H01L 21/20 | (2006.01) |
| H01L 21/36 | (2006.01) |
| H01L 29/02 | (2006.01) |
| H01L 21/308 | (2006.01) |
| H01L 21/762 | (2006.01) |

(52) U.S. Cl.
CPC ............ *H01L 29/02* (2013.01); *H01L 21/3081* (2013.01); *H01L 21/3086* (2013.01); *H01L 21/76224* (2013.01)

(58) Field of Classification Search
USPC ......... 438/259, 270–272, 478, 589, 702, 703, 438/778; 257/139, 288, 330–374, 506, 257/E21.038, E21.039, E21.294, E21.429; 430/5–30, 311–326
See application file for complete search history.

(56) References Cited

U.S. PATENT DOCUMENTS

| | | | |
|---|---|---|---|
| 5,705,301 | A | 1/1998 | Garza et al. |
| 5,972,541 | A | 10/1999 | Sugasawara et al. |
| 6,183,920 | B1 | 2/2001 | Tsujikawa et al. |
| 7,247,887 | B2 | 7/2007 | King |
| 2007/0020565 | A1* | 1/2007 | Koh et al. .................... 430/313 |
| 2007/0158756 | A1* | 7/2007 | Dreeskornfeld et al. ..... 257/374 |
| 2008/0248429 | A1 | 10/2008 | Chou |
| 2009/0108305 | A1 | 4/2009 | Riviere-Cazaux et al. |
| 2009/0233238 | A1 | 9/2009 | Hsu |
| 2009/0258500 | A1 | 10/2009 | Yang |
| 2012/0025230 | A1* | 2/2012 | Yan et al. ........................ 257/93 |
| 2013/0059235 | A1* | 3/2013 | Inazuki et al. .................... 430/5 |

* cited by examiner

*Primary Examiner* — Alexander Ghyka
*Assistant Examiner* — Abdulfattah Mustapha
(74) *Attorney, Agent, or Firm* — Winston Hsu; Scott Margo

(57) ABSTRACT

A method for manufacturing a semiconductor device includes providing a substrate having a mask layer formed thereon, providing a first photomask having a first layout pattern and a second photomask having a second layout pattern, the first layout pattern including a plurality of active area portions and at least a neck portion connecting two adjacent active area portions, transferring the first layout pattern from the first photomask to the mask layer to form a plurality of active area patterns and at least a neck pattern connecting two adjacent active area patterns in the mask layer, and transferring the second layout pattern from the second photomask to the mask layer to remove the neck pattern to form a patterned mask. The patterned mask includes the active area patterns. A slot is at least formed between the two adjacent active area patterns.

19 Claims, 15 Drawing Sheets

US 9,171,898 B2

METHOD FOR MANUFACTURING SEMICONDUCTOR LAYOUT PATTERN, METHOD FOR MANUFACTURING SEMICONDUCTOR DEVICE, AND SEMICONDUCTOR DEVICE

BACKGROUND OF THE INVENTION

1. Field of the Invention

The invention relates to a method for manufacturing a semiconductor layout pattern, a method for manufacturing a semiconductor device, and a semiconductor device, and more particularly, to a method for manufacturing a semiconductor layout pattern, a method for manufacturing a semiconductor device, and a semiconductor device avoiding adverse impact from line-end rounding effect.

2. Description of the Prior Art

Being an essential step in semiconductor fabrication, photolithography is used to transfer layout patterns of specific integrated circuits (ICs) to a photoresist layer formed on a semiconductor chip with a certain percentage and subsequently processed with techniques to transfer the layout pattern to the semiconductor chip.

With the trend toward higher complexity and higher integration for ICs, the size of the device is getting smaller and smaller. It is found that completeness of the layout pattern of the shrunk device is deteriorated after the photolithography process. In other words, deviations between the real layout pattern formed on the chips and the originally designed layout pattern are increased. Such deviations may be caused by several effects, including optical proximity distortions and chemical processing fluctuations. Consequently, effects such as corner rounding, line-end shorting, and line-end rounding are always observed. Additionally, those effect may also have dependency on the substrate material layer and local density of the patterns.

Please refer to FIG. 1, which is a schematic drawing illustrating a photoresist patterned by a conventional photolithography process. As shown in FIG. 1, a patterned pre-layer 12 such as a doped pattern, conductive pattern, or insulating pattern is formed on the wafer 10. Then, a photoresist layer (not shown) is formed on the wafer 10 and followed by performing a photolithography process. Accordingly, an IC layout pattern is transferred to the photoresist layer and thus a patterned photoresist layer 14 is obtained. As shown in FIG. 1, it is desirably expected that all the included angles formed by the overlapped patterned photoresist layer 14 and the patterned pre-layer 12 are 90° (as depicted by the included angle $\theta_2$). However, it is noteworthy that because of the optical proximity effect as mentioned afore, an included angle $\theta_1$ formed by the end of the patterned photoresist layer 14 and patterned pre-layer 12 is not 90° as expected. The acute included angle formed by the patterned photoresist layer 14 and the patterned pre-layer 12 manifests the transferred pattern suffers distortion. Such pattern distortion increases process complexity and causes device distortion or even device loss. Briefly speaking, the pattern distortion adversely impacts the yield of the semiconductor fabrication and the performance of the semiconductor devices.

Since the optical proximity effect cannot be completely avoided from the photolithography process, which means the line-end rounding issue is always found in the photolithography process, there is therefore a continuing need in the semiconductor processing art to diminish the adverse impact rendered from the line-end rounding effect.

SUMMARY OF THE INVENTION

According to the claimed invention, a method for manufacturing a semiconductor device is provided. The method includes providing a substrate having a mask layer formed thereon; providing a first photomask having a first layout pattern, the first layout pattern comprising a plurality of active area portions and at least a neck portion connecting two adjacent active area portions; providing a second photomask having a second layout pattern; transferring the first layout pattern from the first photomask to the mask layer to form a plurality of active area patterns and at least a neck pattern connecting two adjacent active area patterns; and transferring the second layout pattern from the second photomask to the mask layer to remove the neck pattern and to form a patterned mask. The patterned mask includes the active area patterns. A slot is at least formed between the two adjacent active area patterns.

According to the claimed invention, a method for manufacturing a semiconductor pattern is provided. The method includes providing a first pattern having a plurality of individual predetermined active area patterns, providing a second pattern to the first pattern to define a slot between two adjacent predetermined active area patterns, providing a third pattern to the first pattern to form a neck compensation pattern corresponding to the slot, and outputting the first pattern and the neck compensation pattern to a first photomask to form a first layout pattern and outputting the second pattern to a second photomask to form a second layout pattern.

According to the claimed invention, a semiconductor device is provided. The semiconductor device includes a substrate, a plurality of active regions formed in the substrate, and at least a slot formed between two adjacent active regions. The two adjacent active regions at two opposite sides of the slot respectively include at least three obtuse included angles.

According to the method for manufacturing the semiconductor layout pattern provided by the present invention, the neck compensation pattern is formed at where the line-end rounding issue occurs, such as at the slot. And such neck compensation pattern prevents adverse impact to process complexity and yield.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-7 are drawings illustrating a method for manufacturing a semiconductor layout pattern provided by a first preferred embodiment of the present invention, wherein FIG. 3 is a schematic drawing in a step subsequent to FIG. 2, FIG. 4 is a schematic drawing in a step subsequent to FIG. 3, FIG. 5 is a schematic drawing illustrating a modification to the method for manufacturing the semiconductor layout pattern of the preferred embodiment, FIG. 6 is a schematic drawing in a step subsequent to FIG. 4, and FIG. 7 is a schematic drawing in a step subsequent to FIG. 6.

FIGS. 2-4 and 8-10 are drawings illustrating a method for manufacturing a semiconductor layout pattern provided by a second preferred embodiment of the present invention, wherein FIG. 8 is a schematic drawing in a step subsequent to FIG. 4, and FIG. 9 is a schematic drawing in a step subsequent to FIG. 8, and FIG. 10 is a schematic drawing in a step subsequent to FIG. 9.

FIGS. 11-17B are drawings illustrating a method for manufacturing a semiconductor device provided by a preferred embodiment of the present invention, wherein FIG. 12A-12B are schematic drawings in a step subsequent to FIG. 11 while FIG. 12B is a cross-sectional view taken along a line $A_1$-$A_1'$ of FIG. 12A, FIG. 13 is a schematic drawing in a step subsequent to FIG. 12B, FIG. 14 is a schematic drawing in a step subsequent to FIG. 13, FIGS. 15A-15C are schematic drawings in a step subsequent to FIG. 14 while FIG. 16 is a schematic drawing in a step subsequent to FIG. 15B, and FIG. 17A and FIG. 17B are schematic drawings in a step subsequent to FIG. 16 while FIG. 17B is a cross-sectional view taken along a line $A_3$-$A_3'$ of FIG. 17A.

DETAILED DESCRIPTION

Figure 1:
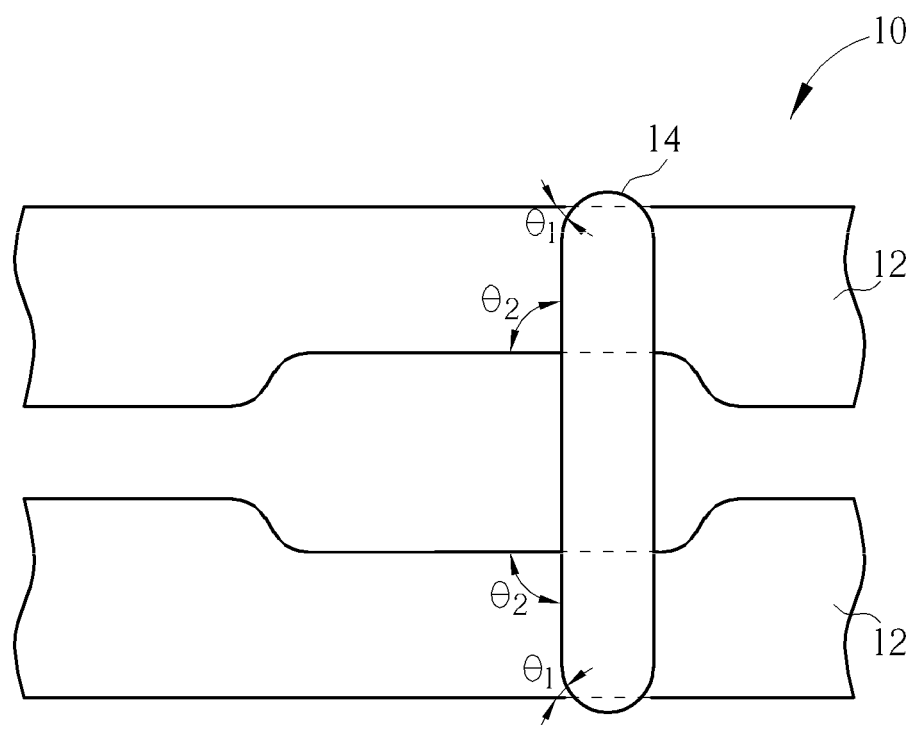
FIG. 1 is a schematic drawing illustrating a photoresist patterned by a conventional photolithography process.
Figure 2:
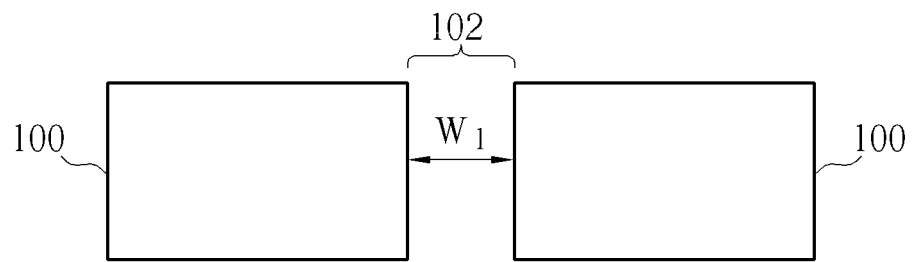

Please refer to FIGS. 2-7, which are drawings illustrating a method for manufacturing a semiconductor layout pattern provided by a first preferred embodiment of the present invention. As shown in FIG. 2, the present preferred embodiment first provides a plurality of individual predetermined active area patterns 100 to a computer system. According to the present preferred embodiment, the predetermined active area patterns 100 are predetermined doped region patterns, but not limited to this. It is noteworthy that a predetermined spacing 102 is formed in between two adjacent predetermined active area patterns 100 as shown in FIG. 2, and the predetermined spacing 102 includes a predetermined width $w_1$. In the present preferred embodiment, the predetermined width $w_1$ is a minimum width. However, it should be easily realized to those skilled in the art that the predetermined width $w_1$ can be equal to or larger than the minimum width.

Figure 3:
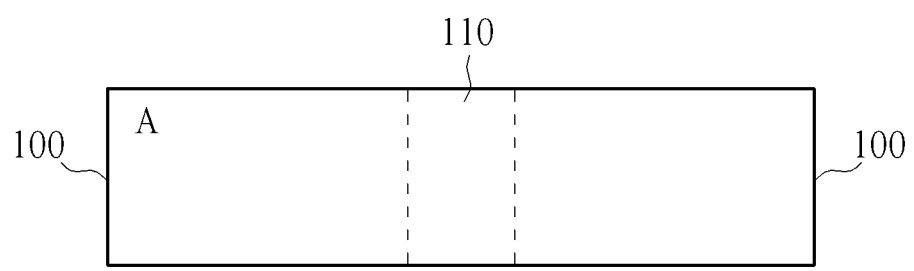

Please refer to FIG. 3. Next, a step of merging the predetermined active area patterns 100 is performed to form a first pattern 110. It is noteworthy that for emphasizing the relationship between the predetermined active area patterns 100 and the first pattern 110, those predetermined active area patterns 100 are depicted by the dotted lines as shown in FIG. 3. In other words, the first pattern 110 still includes the plurality of predetermined active area patterns 100.

Figure 4:
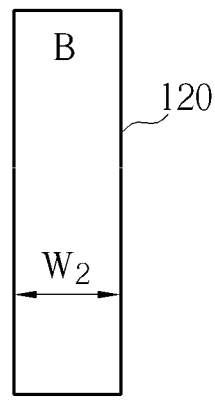

Please refer to FIG. 4. The method for manufacturing the semiconductor layout pattern provided by the present preferred embodiment further provides a second pattern 120, which corresponds to the predetermined spacing 102 between the two adjacent predetermined active area patterns 100, for defining a slot (not shown) between the two adjacent predetermined active area patterns 100. As shown in FIG. 4, a width $w_2$ of the second pattern 120 is equal to the predetermined width $w_1$ of the predetermined spacing 102 between the predetermined active area patterns 100.

Figure 5:
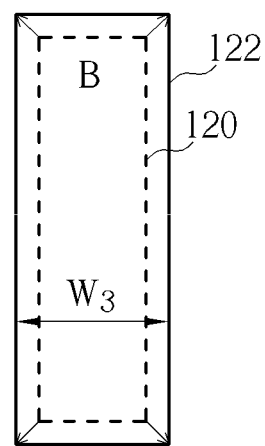

Please refer to FIG. 5, which is a schematic drawing illustrating a modification to the method for manufacturing the semiconductor layout pattern provided by the present preferred embodiment. According to the modification, a step of enlarging the second pattern 120 is performed. Consequently, an enlarged second pattern 122 is obtained. It is noteworthy that a width $w_3$ of the enlarged second pattern 122 is larger than the predetermined width $w_1$ so that the alignment between the first pattern 110 and the enlarged second pattern 122 is improved. Accordingly, the enlarged second pattern 122 helps for winning a larger process window.

Figure 6:
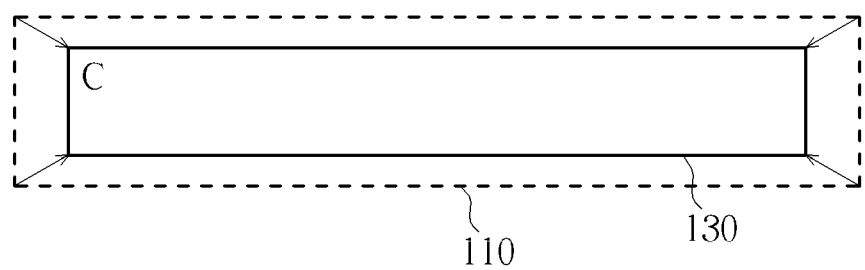

Please refer to FIG. 6. Next, a step of shrinking the first pattern 110 with a certain percentage to form a third pattern 130 is performed according to the method for manufacturing the semiconductor layout pattern provided by the present preferred embodiment.

Figure 7:
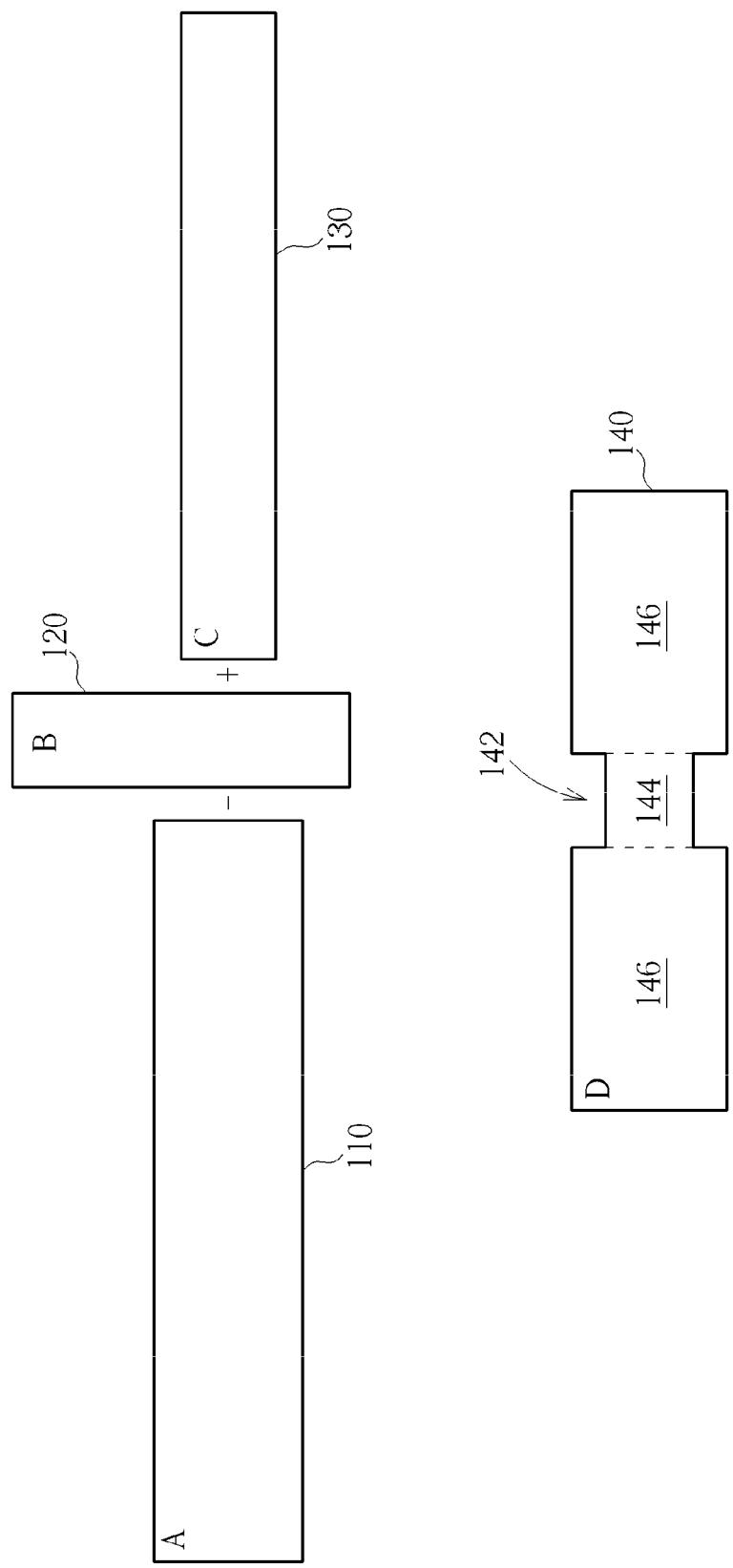

Please refer to FIG. 7. Then, the first pattern 110 and the second pattern 120 are overlapped to remove a portion of the first pattern 110 at where corresponding to the second pattern 120. And a slot 142 is defined. Because when the predetermined width $w_1$ of the predetermined spacing 122 is too small, it increases the difficulty of pattern transferring and causes pattern distortion. Therefore, when the predetermined width $w_1$ is equal to the minimum width, or smaller than a specific value, the present preferred embodiment performs the step of merging the predetermined mined active area patterns 100 at two sides of that predetermined spacing 102 for improving completeness of the transferred pattern. Furthermore, by providing the second pattern 120, which corresponding to the predetermined spacing 122, to define the slot 142 between the merged predetermined active area patterns 100, individual active areas eventually can be obtained with better profile. Accordingly, the second pattern 120 is provided to the first pattern 110 corresponding to the predetermined spacing 102 and to remove the portion of the first pattern 110 for defining the slot 142.

Please still refer to FIG. 7. Next, a step of providing the third pattern 130 to the first pattern 110 is performed to form a neck compensation pattern in the first pattern 110. It is noteworthy that the neck compensation pattern is formed corresponding to the slot 142. Then, by performing an optical proximity correction (OPC), a first layout pattern 140 is obtained as shown in FIG. 7. Subsequently, the first layout pattern 140 is outputted to a first photomask 150 (shown in FIG. 12B). The first layout pattern 140 includes a plurality of active area portions 146 (corresponding to the predetermined active area patterns 100) and a neck portion 144 formed in the slot 142 (corresponding to the predetermined spacing 102). It is noteworthy that the neck portion 144 connects two adjacent active area portions 146. Additionally, an OPC is performed to the second pattern 120, and followed by outputting the second pattern 120 to a photomask 152 (shown in FIG. 14) to form a second layout pattern 148.

It is noteworthy that the present preferred embodiment provides a Boolean operation for forming the first layout pattern 140. Accordingly, when the predetermined width $w_1$ of the predetermined spacing 102 is equal to or smaller than a specific value, the predetermined active area patterns 100 at two sides of that predetermined spacing 102 is merged to form the first pattern 110, and the first pattern 110 is defined as A. Then, the second pattern 120 for defining the slot 142 is defined as B, the third pattern 130, which is obtained by shrinking the first pattern 110 with a certain percentage, is defined as D, and the first layout pattern 140 which is the expected layout pattern is defined as D. The first layout pattern D (140) is obtained by performing the following Boolean operation:

$$D = (A \text{ not } B) \text{ or } C$$

According to the method for manufacturing the semiconductor layout pattern provided by the present preferred embodiment, the predetermined active area patterns 100 of which the predetermined width $w_1$ of the predetermined spacer 102 is equal to or smaller than a specific value are merged to form the first pattern 110. Then, by providing the second pattern 120 to define the slot 142 (corresponds to the predetermined spacing 102), it is assured that final active areas are all formed individually and independently. More important, by forming the neck portion 144 in the slot 142 between the two adjacent active area portions 146, process complexity and pattern distortion issues are all prevented according to the present preferred embodiment.

Please refer to FIGS. 2-4 and 8-10, which are drawings illustrating a method for manufacturing a semiconductor layout pattern provided by a second preferred embodiment of the present invention. It should be noted that elements the same in the first and second preferred embodiments are designated by the same numerals and those related details are omitted for simplicity. As shown in FIGS. 2-4, the present preferred embodiment also provides a plurality of individual predetermined active area patterns 100, and a predetermined spacing 102 is formed in between two adjacent predetermined active area patterns 100 as shown in FIG. 2. Then, those predetermined active area patterns 100 are merged to form a first pattern 110 as shown in FIG. 3. Simultaneously, a second pattern 120 is provided as shown in FIG. 4.

Figure 8:
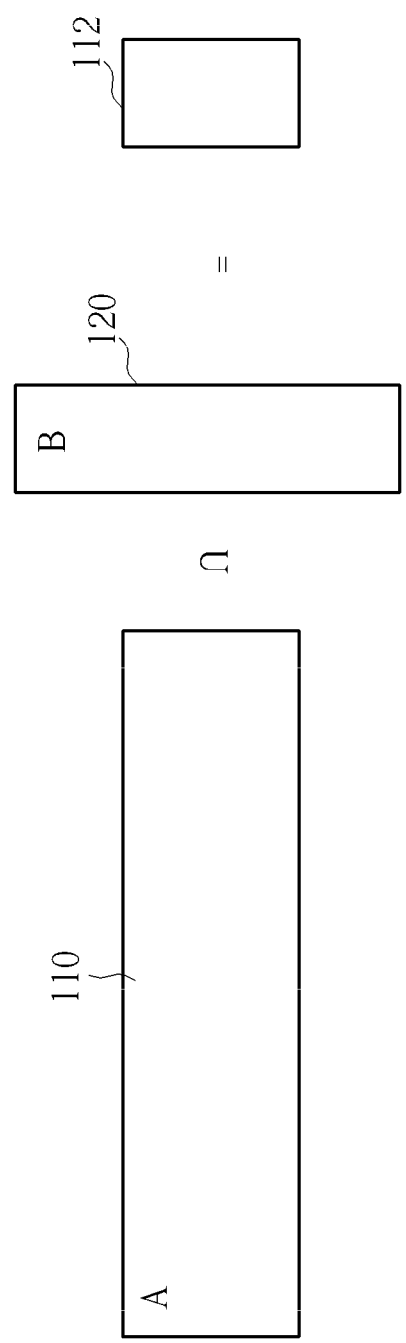
Figure 9:
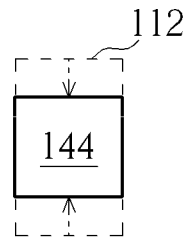

Please refer to FIG. 8 subsequently to FIG. 4. According to the preferred embodiment, an intersection pattern 112 is formed by intersecting the first pattern 110 and the second pattern 120. Next, as shown in FIG. 9, a step of shrinking the intersection pattern 120 with a certain percentage is performed to form a predetermined compensation pattern 114.

Figure 10:
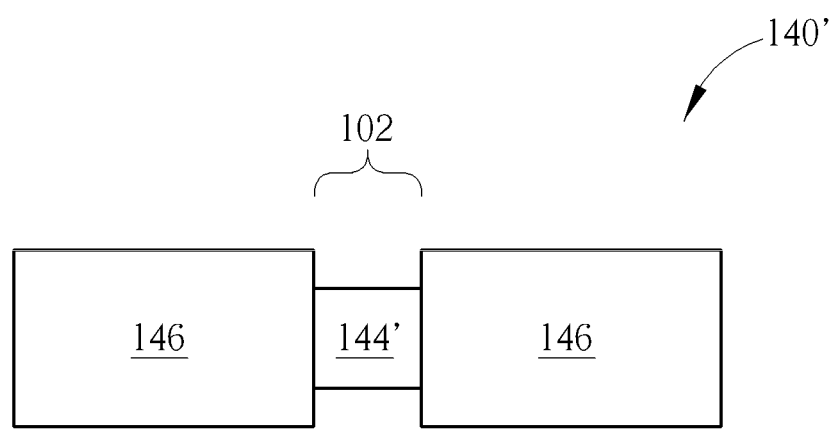

Please refer to FIG. 10. Then, the predetermined compensation pattern 114 is provided to the predetermined active are patterns 100. Particularly, the predetermined compensation pattern 114 is formed correspondingly to the predetermined spacing 102. Subsequently, after performing an OPC, a first layout pattern 140' is obtained as shown in FIG. 10. Then, the first layout pattern 140' is outputted to a first photomask 150 (shown in FIG. 12B). The first layout pattern 140' includes a plurality of active area portions 146 (corresponding to the predetermined active area patterns 100) and a neck portion 144' (corresponding to the predetermined compensation patter 114). It is noteworthy that the neck portion 144' connects two adjacent active area portions 146. Additionally, an OPC is performed to the second pattern 120, and followed by outputting the second pattern 120 to a photomask 152 (shown in FIG. 14) to form a second layout pattern 148.

According to the method for manufacturing the semiconductor layout pattern provided by the present preferred embodiment, the predetermined compensation pattern 114 is formed by shrinking the intersection pattern, which is an intersection of the first pattern 110 and the second pattern 120. The predetermined compensation pattern 114 transferred to the first mask 150 then become the neck portion 144 between the two adjacent active area portions 146. Consequently, process complexity and pattern distortion issues are all prevented according to the present preferred embodiment.

Figure 11:
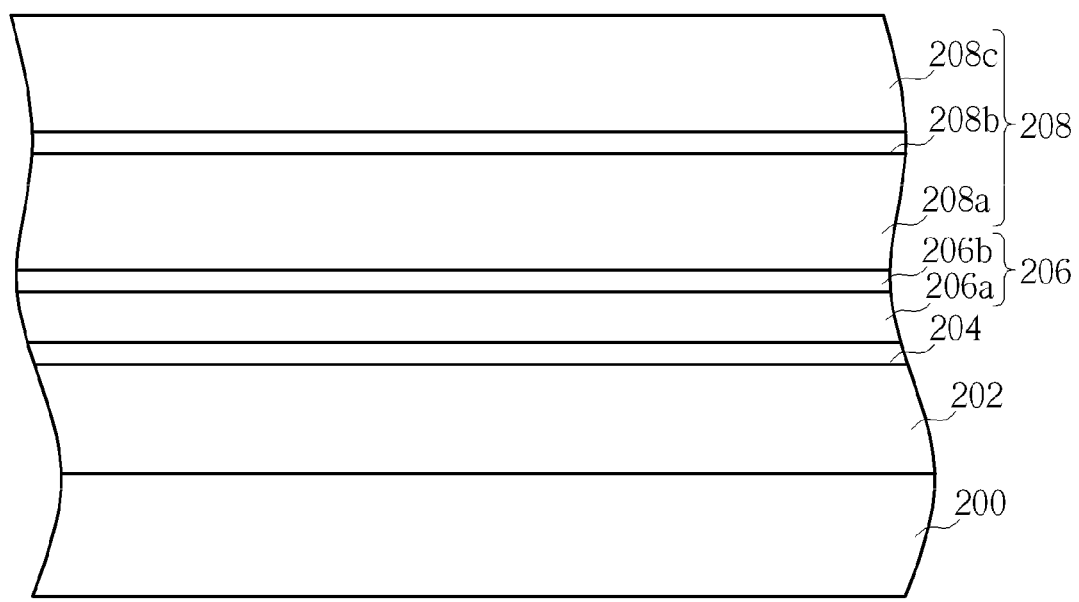

Please refer to FIGS. 11-17B, which are drawings illustrating a method for manufacturing a semiconductor device provided by a preferred embodiment of the present invention. As shown in FIG. 11, a substrate 200 is provided. The substrate 200 can be a silicon substrate, but not limited to this. A doped region 202 is selectively formed in the substrate 200 and a pad oxide layer 204 and a first mask layer 206 are sequentially formed on the substrate 200. According to the present preferred embodiment, the first mask layer 206 is a multilayered mask layer and sequentially includes a silicon nitride layer 206a and a silicon oxide layer 206b, but not limited to this. As shown in FIG. 11, a second mask layer 208 is formed on the first mask layer 206. According to the preferred embodiment, the second mask layer 208 sequentially includes an organic dielectric layer (ODL) 208a, a silicon-containing hardmask bottom anti-reflecting coating (SHB) 208b and a photoresist (PR) layer 208c. Additionally, since amorphous carbon layer such as advanced patterning film (APF) has the advantages of high aspect ratio (HAR), lower line edge roughness (LER) and PR-like ashablity, the APF can be used to replace the ODL 208a according to the preferred embodiment. Briefly speaking, the second mask layer 208 is a tri-layered structure and exemplarily includes an ODL/SHB/PR structure or an APF/Silicon inorganic dielectric layer/PR structure, but not limited thereto.

Figure 12A:
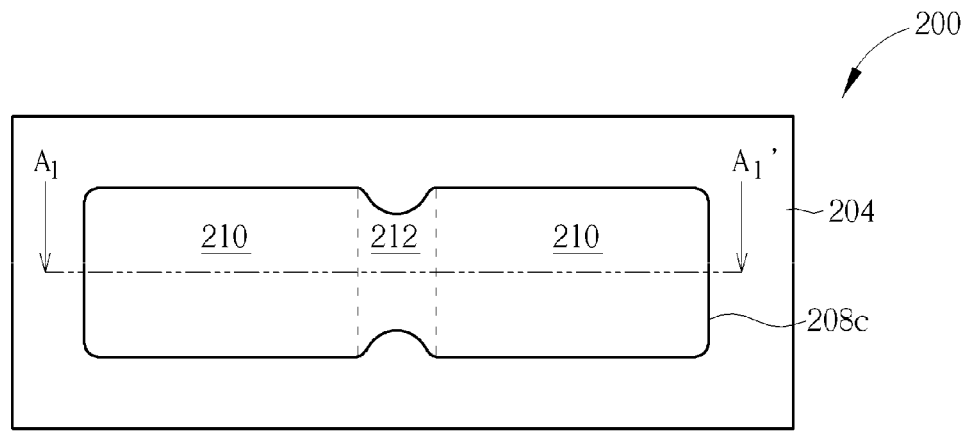
Figure 12B:
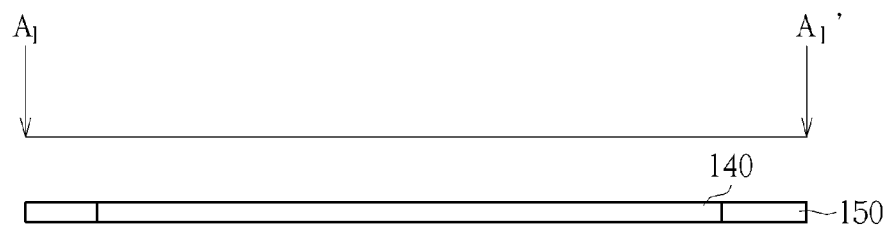
Figure 12B:
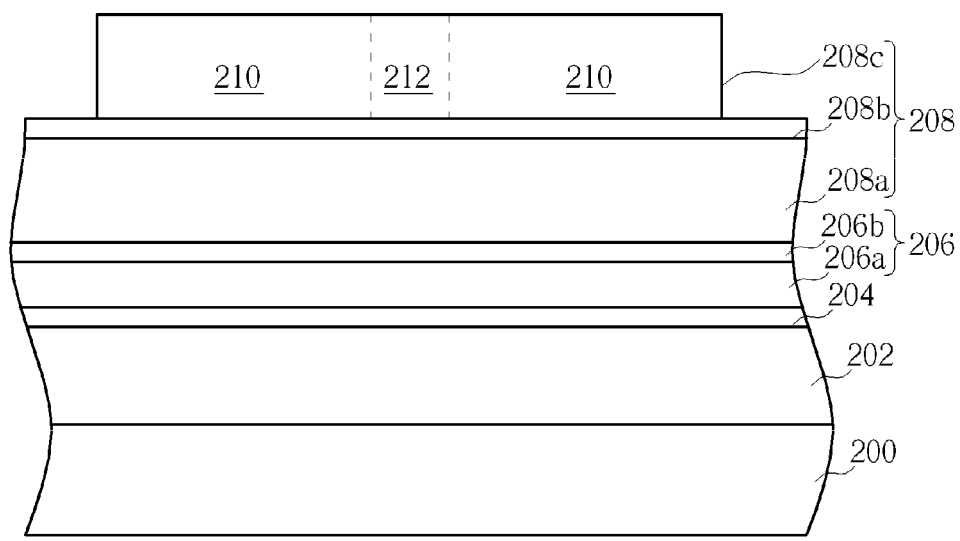

Please refer to FIGS. 12A-12B, it should be noted that FIG. 12B is a cross-sectional view taken along a line $A_1$-$A_1'$ of FIG. 12A. As shown in FIGS. 12A and 12B, the method for manufacturing the semiconductor device of the present preferred embodiment provides the first photomask 150 having the first layout pattern 140 obtained by the method for manufacturing the semiconductor layout pattern as mentioned above. The first layout pattern 140 includes a plurality of active area portions 146, at least a slot 142 formed between two adjacent active area portions 146, and a neck portion 144 formed in the slot 142 as shown in FIG. 7. More important, the neck portion 144 connects the two adjacent active area portions 146. Next, the first layout pattern 140 is transferred from the first photomask 150 to the photoresist layer 208c of the second mask layer 208 and to form a plurality of active area patterns 210 and at least a neck pattern 212 connecting the two adjacent active area patterns 210. It is also noteworthy that due to the optical proximity effect, all the right angles in the photomask 150 are rounded to be arc angles in the photoresist layer 208c as shown in FIG. 12A.

Figure 13:
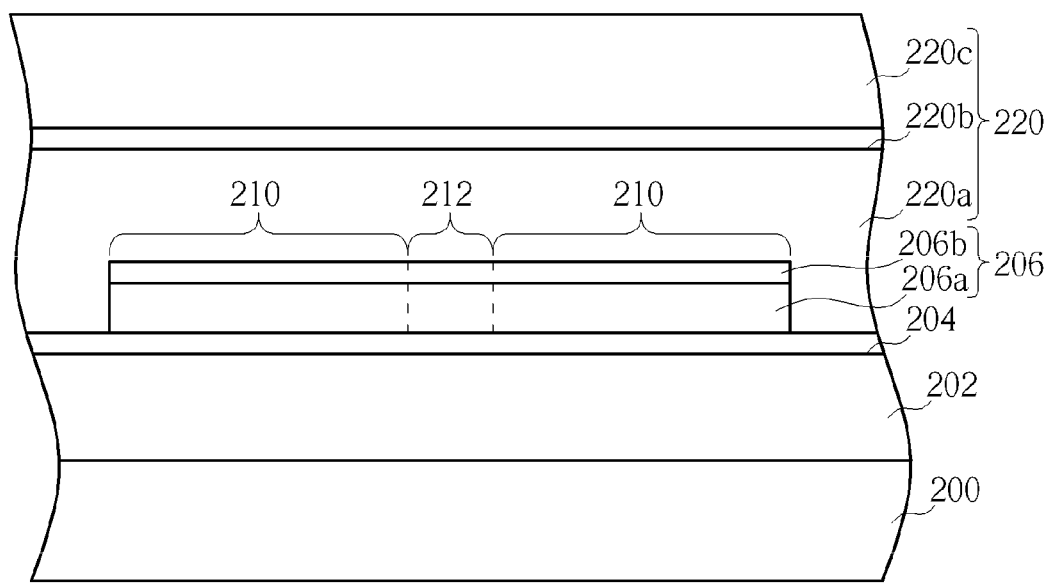

Please refer to FIG. 13. Next, the SHB 208b, the ODL 208a and the first mask layer 206 exposed by the photoresist layer 208c are etched, and the pad oxide layer 204 is exposed. Thus, the active area patterns 210 and the neck pattern 212 are transferred to the first mask layer 206. Then, the second mask layer 208 (including the ODL 208a, the SHB 208b and the photoresist 208c) are removed and followed by forming a third mask layer 220. The third mask layer 220 also includes a tri-layered structure. Similar to the second mask layer 208, the third mask layer 220 sequentially includes an ODL 220a, a SHB 220b and a photoresist layer 220c. In the same concept, APF/Silicon inorganic dielectric layer/PR can also be used, but not limited thereto.

Figure 14:
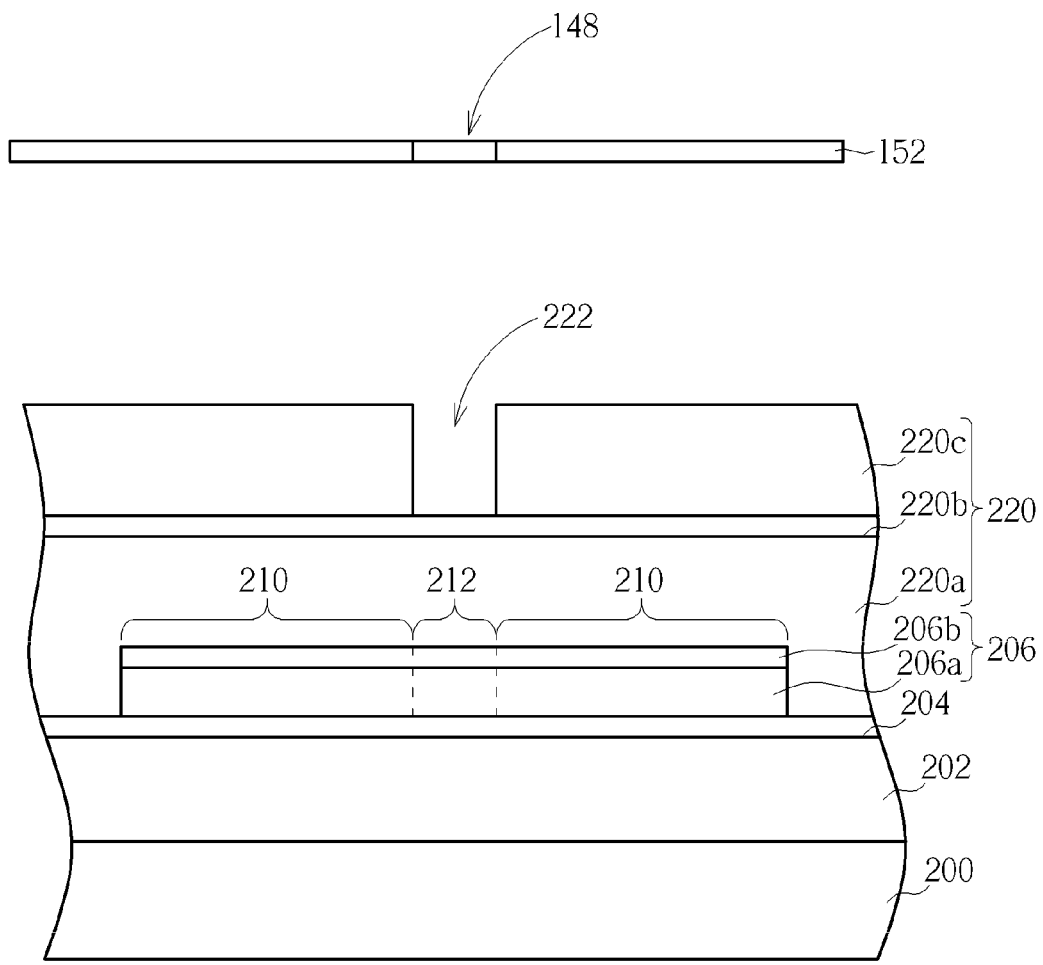

Please refer to FIG. 14. After transferring the active area patterns 210 and the neck pattern 212 to the first mask layer 206 and forming the third mask layer 220, a second photomask 152 having the second layout pattern 148 obtained by the aforementioned method is provided. Subsequently, the second layout pattern 148 is transferred from the second photomask 152 to the photoresist layer 220c. It is noteworthy that the second layout pattern 148 is transferred corresponding to the neck pattern 212 and thus at least an opening pattern 222 is formed in the photoresist layer 220c correspondingly to the neck pattern 212.

Figure 15A:
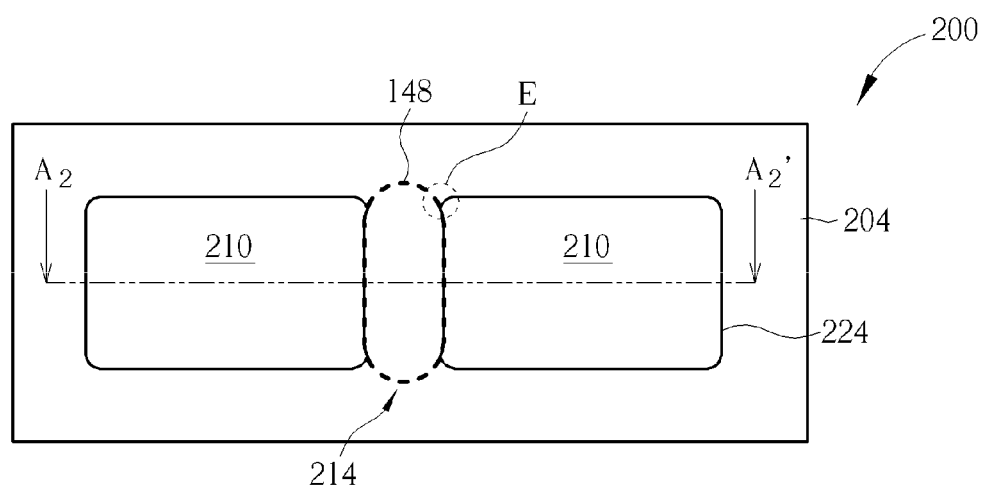
Figure 15B:
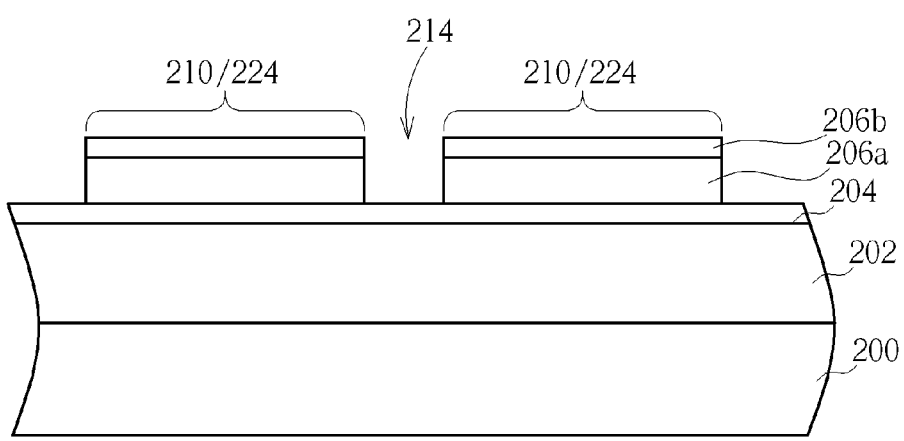
FIG. 15B is a cross-sectional view taken along a line $A_2$-$A_2'$ of FIG. 15A
Figure 15C:
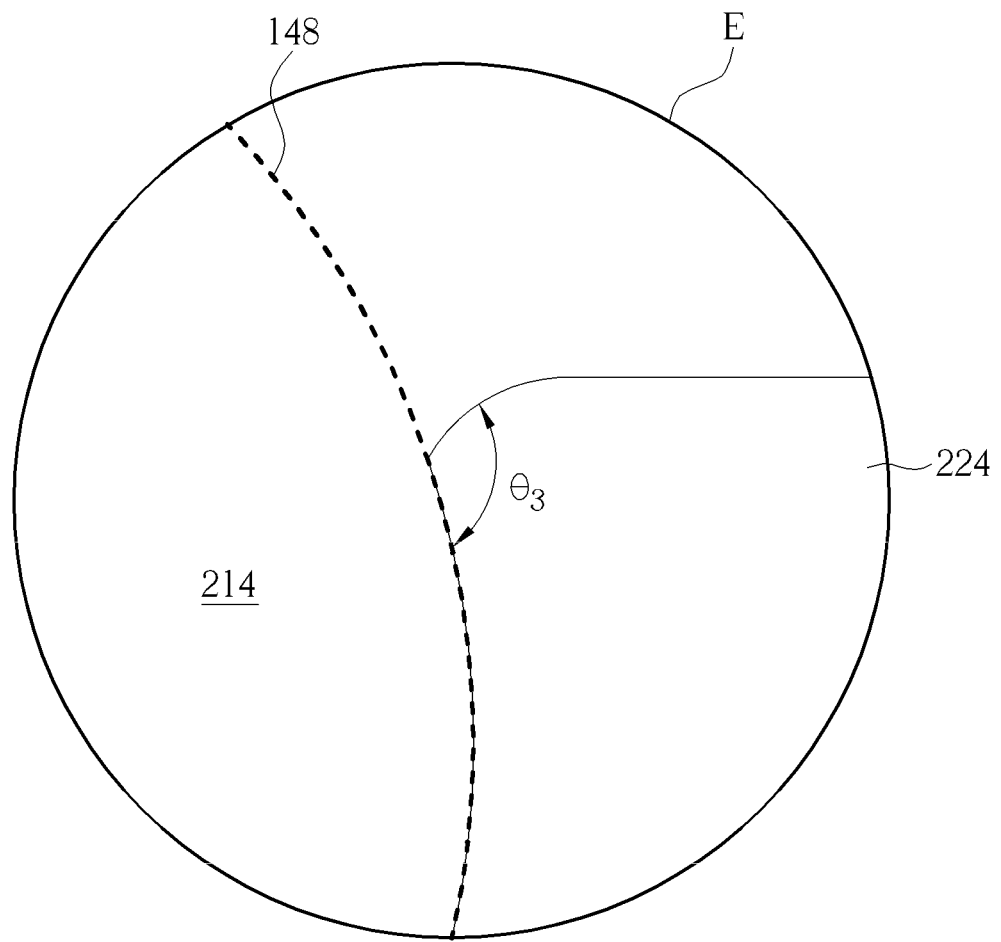
FIG. 15C is a schematic drawing of an enlarged portion designated by Circle E in FIG. 15A.

Please refer to FIGS. 15A-15C. It should be noted that FIG. 15B is a cross-sectional view taken along a line $A_2$-$A_2'$ of FIG. 15A, and FIG. 15C is a schematic drawing of an enlarged portion designated by Circle E in FIG. 15A. For clarifying the relationship between the second layout pattern 148, the active area patterns 210, and the neck pattern 212, the second layout pattern 148 is emphasized by dotted line in FIG. 15A and FIG. 15C. As shown in FIGS. 15A-15C, after transferring the second layout pattern 148 to the photoresist layer 220c and forming the opening pattern 222, an etching step is performed to etch the SHB 220b, the ODL 220c and the first mask layer 206 through the opening pattern 222. The etch step stops at the pad oxide layer 204 and thus a portion of the pad oxide layer 204 is exposed. It is noteworthy that the etching step is performed to remove the neck pattern 212 from the first mask layer 206 and to form a patterned mask 224. As shown in FIG. 15B, the patterned mask 224 includes those active area patterns 210. More important, a slot 214 is at least formed in between two adjacent active area patterns 210. Then, the third mask layer 220 (including the photoresist layer 220c, the SHB 220b and the ODL 220a) is removed and the patterned mask 224 is remained as shown in FIGS. 15A-15B. It should be noted that the slot 214 is formed at where the neck pattern 212 once occupied. Since the neck pattern 212 is removed by this step, individual and independent active area patterns 210 as expected are obtained. Furthermore, though the present preferred embodiment utilizes the litho-etch-litho-etch (2P2E) approach, but those skilled in the art should easily realize that litho-litho-etch (2P1E) approach can also be adopted to the preferred embodiment.

Please refer to FIG. 15C. More important, due to the optical proximity effect, line-end rounding issue can not be ignored during transferring the second layout pattern 148. However, because the present preferred embodiment provides the neck pattern 212 in the two adjacent active area patterns 210, the adverse impact to the active area patterns 210 due to the line-end rounding effect generated by transferring the second layout pattern 148 is surprisingly diminished. As shown in FIG. 15C, after removing the neck pattern 212, the active area patterns 210 at two sides of the slot 214 respectively have included angles $\theta_3$, and the included angle $\theta_3$ is larger than 90°. In other words, the active area pattern 210 obtains two obtuse included angles at the side of the slot 214. As mentioned above, since the rounding effect also occurs during transferring the first layout pattern 140, corners of the active area patterns 210 are also rounded. Consequently, each of the active area patterns 210 at two sides of the slot 214 possesses at least three obtuse included angles as shown in FIG. 15A. For example, the active area patterns 210 in the present preferred embodiment possess four obtuse included angles. Even more, all of the corners of the active area patterns 210 provided by the present invention are obtuse included angles, especially the corner at the sides of the slot 214.

Figure 16:
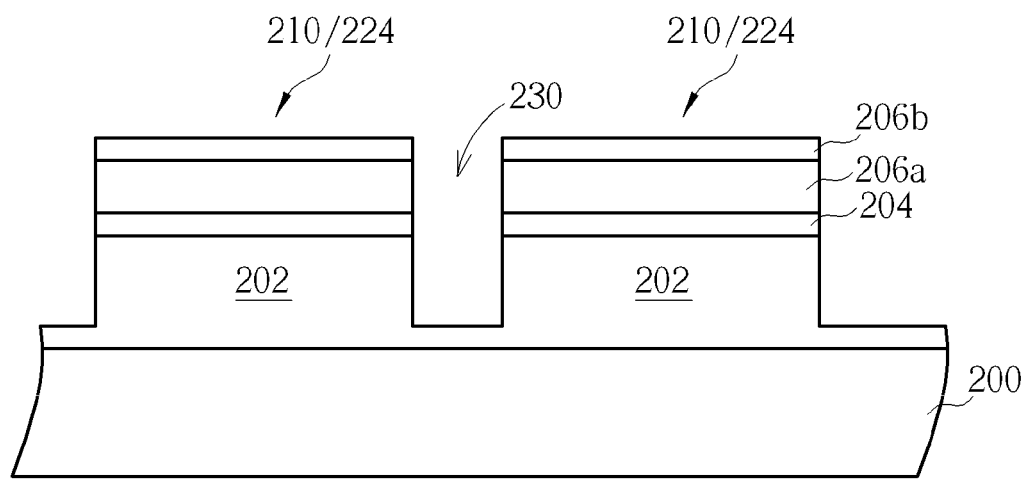

Please refer to FIG. 16. After forming the individual and independent active area patterns 210, an etching process is performed to etch the pad oxide layer 204 and the substrate 200 through the patterned mask 224 to form a plurality of trenches 230 in the substrate 200.

Figure 17A:
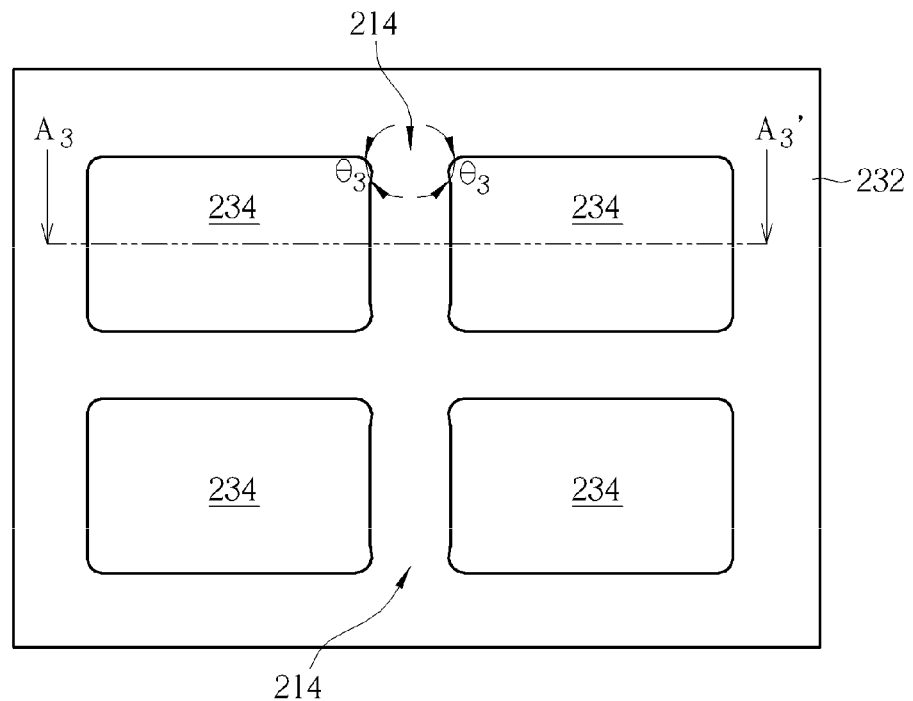
Figure 17B:
Figure 17B:
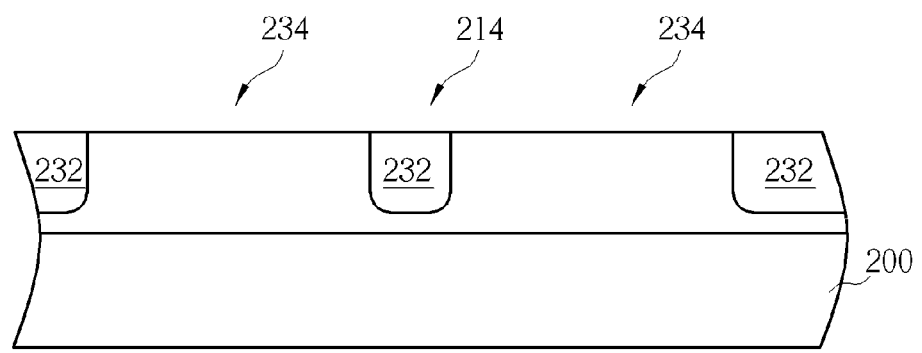

Please refer to FIGS. 17A-17B, It should be noted that FIG. 17B is a cross-sectional view taken along a line $A_3$-$A_3$' of FIG. 13A. After forming the trenches 230, an insulating material is provided to fill up the trenches 230, especially in the trench at the slot 214 according to the present preferred embodiment. Subsequently, a planarization process is performed to remove unnecessary insulating material, patterned mask 224 and the pad oxide layer 204, and thus a shallow trench isolation (STI) 232 and active regions 234 surrounded and electrically isolated by the STI 232 are obtained.

Please still refer to FIGS. 17A-17B. According to the method for manufacturing the semiconductor device provided by the present invention, the formed semiconductor device includes the substrate 200, the plurality of active regions 234 formed in the substrate 200, and at least a slot 214 formed between two adjacent active regions 234. In the present preferred embodiment, the active regions 234 respectively include a doped region 202, but note limited to this. As shown in FIG. 17A, the two active regions 234 at two sides of the slot 214 respectively possess at least three obtuse included angles. More important, the two included angles $\theta_3$ of the active regions 234 at the sides of the slot 214 are always obtuse angles according to the present invention. It is also noteworthy that since the two included angles $\eta_3$ of the active regions 234 at the sides of the slot 214 are always obtuse angles, it is much easier and smoother when filling the trenches 230, especially filling the trench at the slot 214, with the insulating material. Accordingly, electrical isolation at the slot 214 is improved.

According to the method for manufacturing the semiconductor device provided by the present preferred embodiment, the neck pattern 212 is formed between the two adjacent active area patterns 210. More important, the neck pattern 212 is formed at where the slot 214, which spaces apart the two adjacent active area patterns 210, suppose to be formed. Accordingly, the neck pattern 212 prevents the active area patterns 210 from the adverse impact generated by the line-end rounding effect during forming the slot 214. Consequently, the profile of the active regions 234 is obtained as expected after forming the STI 232 that surrounding the active regions 234 and thus electrical isolation rendered to the active regions 234, especially to the active regions 234 at two sides of the slot, is improved.

According to the method for manufacturing semiconductor layout pattern provided by the present invention, the neck compensation pattern is formed at where the line-end rounding issue occurs, such as at the slot. And such neck compensation pattern prevents adverse impact to process complexity and yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a semiconductor device, comprising:
   providing a substrate having a mask layer formed thereon;
   providing a first photomask having a first layout pattern, the first layout pattern comprising a plurality of active area portions and at least a neck portion connecting two adjacent active area portions;
   providing a second photomask having a second layout pattern;
   transferring the first layout pattern from the first photomask to the mask layer to form a plurality of active area patterns and at least a neck pattern connecting the two adjacent active area patterns; and
   transferring the second layout pattern from the second photomask to the mask layer to remove the neck pattern and to form a patterned mask, the patterned mask comprising the active area patterns, wherein a slot is at least formed between the two adjacent active area patterns and the slot is formed at a position where the neck pattern once occupied.

2. The method for manufacturing the semiconductor device according to claim 1, wherein the active area patterns formed at two opposite sides of the slot respectively comprise at least three obtuse included angles.

3. The method for manufacturing the semiconductor device according to claim 1, wherein the mask layer comprises a multilayered mask layer.

4. The method for manufacturing the semiconductor device according to claim 3, further comprising:
   performing an etching process to etch the substrate through the patterned mask to form a plurality of trenches; and
   filling the trenches with an insulating material.

5. The method for manufacturing the semiconductor device according to claim 1, wherein the first layout pattern and the second layout pattern are formed by a process that comprises:
- providing a first pattern having a plurality of individual predetermined active area patterns;
- providing a second pattern to the first pattern to define a slot between two adjacent predetermined active area patterns;
- providing a third pattern to the first pattern to form a neck compensation pattern corresponding to the slot; and
- outputting the first pattern and the neck compensation pattern to the first photomask to form the first layout pattern and outputting the second pattern to the second photomask to form the second layout pattern.

6. The method for manufacturing the semiconductor device according to claim 5, further comprising a step of merging the predetermined active area patterns to form the first pattern.

7. The method for manufacturing the semiconductor device according to claim 6, further comprising a step of overlapping the first pattern and the second pattern to remove a portion of the first pattern corresponding to the second pattern to define the slot between the two adjacent predetermined active area patterns before providing the third pattern.

8. The method for manufacturing the semiconductor device according to claim 7, further comprising a step of enlarging the second pattern before overlapping the first pattern and the second pattern.

9. The method for manufacturing the semiconductor device according to claim 5, further comprising a step of shrinking the first pattern to form the third pattern.

10. The method for manufacturing the semiconductor device according to claim 5, further comprising a step of performing an optical proximity correction (OPC) before outputting the first pattern to the first photomask and outputting the second pattern to the second photomask, respectively.

11. A method for manufacturing a semiconductor pattern, comprising:
- providing a first pattern, the first pattern comprising a plurality of individual predetermined active area patterns;
- providing a second pattern to the first pattern to define a slot between two adjacent predetermined active area patterns;
- providing a third pattern to the first pattern to form a neck compensation pattern corresponding to the slot, a width of the neck compensation pattern being equal to a width of the slot; and
- outputting the first pattern and the neck compensation pattern to a first photomask to form a first layout pattern and outputting the second pattern to a second photomask to form a second layout pattern.

12. The method for manufacturing the semiconductor pattern according to claim 11, further comprising a step of merging the predetermined active area patterns to form the first pattern.

13. The method for manufacturing the semiconductor pattern according to claim 12, further comprising a step of overlapping the first pattern and the second pattern to remove a portion of the first pattern corresponding to the second pattern to define the slot between the two adjacent predetermined active area patterns before providing the third pattern.

14. The method for manufacturing the semiconductor pattern according to claim 13, further comprising a step of enlarging the second pattern before overlapping the first pattern and the second pattern.

15. The method for manufacturing the semiconductor pattern according to claim 11, further comprising a step of shrinking the first pattern to form the third pattern.

16. The method for manufacturing the semiconductor pattern according to claim 11, further comprising a step of performing an optical proximity correction before outputting the first pattern to the first photomask and outputting the second pattern to the second photomask, respectively.

17. A semiconductor device comprising:
- a substrate;
- a plurality of active regions formed in the substrate; and
- at least a slot formed between two adjacent active regions, the two adjacent active regions at two opposite sides of the slot respectively comprising at least three obtuse included angles.

18. The semiconductor device according to claim 17, wherein the active regions respectively comprise a doped region.

19. The semiconductor device according to claim 18, further comprising an insulating material surrounding the active regions and filling up the slot.

\* \* \* \* \*